(12) United States Patent
Zortman et al.

(10) Patent No.: US 10,942,215 B2
(45) Date of Patent: Mar. 9, 2021

(54) INTEGRATED CIRCUIT AUTHENTICATION FROM A DIE MATERIAL MEASUREMENT

(71) Applicant: National Technology & Engineering Solutions of Sandia, LLC, Albuquerque, NM (US)

(72) Inventors: William A. Zortman, Corrales, NM (US); Ryan Helinski, Albuquerque, NM (US); Jason Hamlet, Albuquerque, NM (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 100 days.

(21) Appl. No.: 16/545,943

(22) Filed: Aug. 20, 2019

(65) Prior Publication Data

US 2019/0377024 A1    Dec. 12, 2019

Related U.S. Application Data

(62) Division of application No. 15/221,814, filed on Jul. 28, 2016, now Pat. No. 10,429,438.

(51) Int. Cl.
*G01R 31/26* (2020.01)
*H01L 21/26* (2006.01)
(Continued)

(52) U.S. Cl.
CPC .......... *G01R 31/2851* (2013.01); *H01L 22/34* (2013.01)

(58) Field of Classification Search
CPC ........ G01R 31/02; G01R 31/26; G01R 31/28; G01R 31/2851; G01R 21/26; G01R 21/268; G01R 21/76; G01R 21/768; G01R 22/34

See application file for complete search history.

(56) References Cited

U.S. PATENT DOCUMENTS

2005/0007252 A1    1/2005 Arneson et al.
2005/0085032 A1    4/2005 Aghababazadeh et al.
(Continued)

OTHER PUBLICATIONS

Suh, et al., "Physical Unclonable Functions for Device Authentication and Secret Key Generation", Design Automation Conference (DAC) 2007, San Diego, USA, Jun. 4-8, 2007, pp. 1-6.
(Continued)

*Primary Examiner* — Neel D Shah
(74) *Attorney, Agent, or Firm* — Madelynne J. Farber; Mark A. Dodd

(57) ABSTRACT

The various technologies presented herein relate to measuring a signal generated by a die-based test circuit incorporated into an IC and utilizing the measured signal to authenticate the IC. The signal can be based upon a sensor response generated by the test circuit fabricated into the die, wherein the sensor response is based upon a property of the die material. The signal can be compared with a reference value obtained from one or more test circuit(s) respectively located on one or more reference dies, wherein the reference dies are respectively cut from different wafers, and the location at which the reference dies were cut is known. If the measured signal matches the reference value, the die is deemed to be from the same cut location as the dies from which the reference value was obtained. If the measured signal does not match the reference value, the die is not authenticated.

20 Claims, 4 Drawing Sheets

(51) Int. Cl.
*G01R 31/28* (2006.01)
*H01L 21/66* (2006.01)

(56) References Cited

U.S. PATENT DOCUMENTS

| | | | |
|---|---|---|---|
| 2011/0156033 A1* | 6/2011 | Bintang | H01L 21/568 |
| | | | 257/48 |
| 2015/0123702 A1* | 5/2015 | McKinley | H01L 23/576 |
| | | | 326/8 |

OTHER PUBLICATIONS

Virtual Socket Interface (VSI) Alliance: "Intellectual Property Protection: Schemes, Alternatives and Discussion" Intellectual Property Protection Development Working Group (DWG), (IPPWP 1 1.1) Released Aug. 2000, Revision: Jan. 1, 2008, pp. 1-17.

Guin, et al., "Counterfeit Integrated Circuits: Detection, Avoidance, and the Challenges Ahead", Journal of Electronic Test (J Electron Test), Feb. 2014, vol. 30, Iss. 1, pp. 9-23.

Goertzel, K. M., "Integrated Circuit Security Threats and Hardware Assurance Countermeasures", The Journal of Defense Software Engineering, Crosstalk—Nov./Dec. 2013, pp. 33-38.

Gassend, et al., "Identification and Authentication of Integrated Circuits", Massachusetts Institute of Technology—Laboratory for Computer Science; Journal of Concurrency and Computation: Practice & Experience Jun. 2003, pp. 1-24.

* cited by examiner

INTEGRATED CIRCUIT AUTHENTICATION FROM A DIE MATERIAL MEASUREMENT

CROSS-REFERENCE TO RELATED APPLICATIONS

This application is a divisional application of and discloses subject matter that is related to subject matter disclosed in, co-pending parent application U.S. Ser. No. 15/221,814, filed Jul. 28, 2016 and entitled "INTEGRATED CIRCUIT AUTHENTICATION FROM A DIE MATERIAL MEASUREMENT". The present application claims the priority of its parent application which is incorporated herein by reference in its entirety.

STATEMENT OF GOVERNMENTAL INTEREST

This invention was developed under contract DE-AC04-94AL85000 between Sandia Corporation and the U.S. Department of Energy. The U.S. Government has certain rights in this invention.

BACKGROUND

A concern of supply chain assurance is that a component has not been cloned and/or tampered with, and accordingly a customer has a high level of trust that received components are authentic. For example, a company that assembles digital devices wants to be confident that a supplier is providing trustworthy integrated circuits (ICs), and the ICs have not been created, or tampered with, by a malicious entity that intends to incorporate cloned ICs into the assembled digital devices. In another example, a customer wants to know that a supplier is providing ICs manufactured in accordance with the customer's requirements, including fabrication of wafers and dies which are utilized to form the ICs.

Often, the customer can only rely on a supplier's assurance that a die was manufactured at a particular plant, at a particular time, e.g., as identified by a label provided with the die. However, the manufacturer can manipulate process information to give the impression that the die satisfies processing requirements, but in actuality, the die has been substituted with a die manufactured on different equipment, the die was manufactured at a different time and/or date to that disclosed by the manufacturer, the die is not sourced from wafer manufactured to customer requirements, etc. Further, conventional approaches of determining that an IC is authentic can require destructive testing of a portion of ICs received from a supplier, making such supply chain assurance costly in both time and inventory.

SUMMARY

The following is a brief summary of subject matter that is described in greater detail herein. This summary is not intended to be limiting as to the scope of the claims.

Various technologies presented herein relate to measuring a signal generated by a test circuit incorporated into a die included in an IC to facilitate authentication of the IC. In an embodiment, a plurality of reference data is compiled for a plurality of dies cut from a plurality of wafers (reference wafers). The reference data is separated out by location of each die in each respective wafer, e.g., data for dies cut from a central position of the wafers are compiled together, data for dies cut from an upper left position of the wafers are compiled together, data for dies cut from an upper right position of the wafers are compiled together, etc. Wafers manufactured under the same processing conditions (e.g., manufactured on the same equipment at the same fabrication plant (fab lab)) have the same property distributions across them, and accordingly the same test circuit signals generated therefrom. Each die cut from the same position on a wafer will have the same (or similar) properties.

A signal generated by a test circuit located on a die to be authenticated can be measured, wherein the die is identified as being sourced from a particular location in a wafer, e.g., the die is cut from the center of the wafer. The measured signal can be compared with the reference data obtained for dies cut from the center location of the plurality of reference wafers. In the event of the measured signal and reference value matching (or being within an acceptable and/or desired range of each other), a notification can be generated indicating that the die is from the indicated location (e.g., cut from the center of the wafer). In the event of the measured signal and reference value not matching (or are not within an acceptable and/or desired range of each other), a notification can be generated indicating that the die is not from the indicated location, and the die can be quarantined for further analysis. Hence, by comparing a signal generated by a test circuit incorporated into a die having an uncertain origin with reference data compiled from dies having a known origin (e.g., a known cut location), it is possible to authenticate the die based thereon, and accordingly an IC into which the die is incorporated.

The signal respectively measured for the test die and the reference dies can be generated by a test circuit respectively incorporated into material forming each of the test die and the reference dies, wherein any signal or measurement (sensor response) generated at the respective test circuit is a function of one or more characteristics and/or properties of the die material forming that particular die. While it may be possible for an entity to precisely replicate a test circuit across a plurality of dies, it is not possible for the entity to replicate the characteristics of the underlying die material. Hence, a signal response from a test circuit is based upon the material it is formed from, which the entity cannot replicate.

The above summary presents a simplified summary in order to provide a basic understanding of some aspects of the systems and/or methods discussed herein. This summary is not an extensive overview of the systems and/or methods discussed herein. It is not intended to identify key/critical elements or to delineate the scope of such systems and/or methods. Its sole purpose is to present some concepts in a simplified form as a prelude to the more detailed description that is presented later.

DETAILED DESCRIPTION

Figure 1:
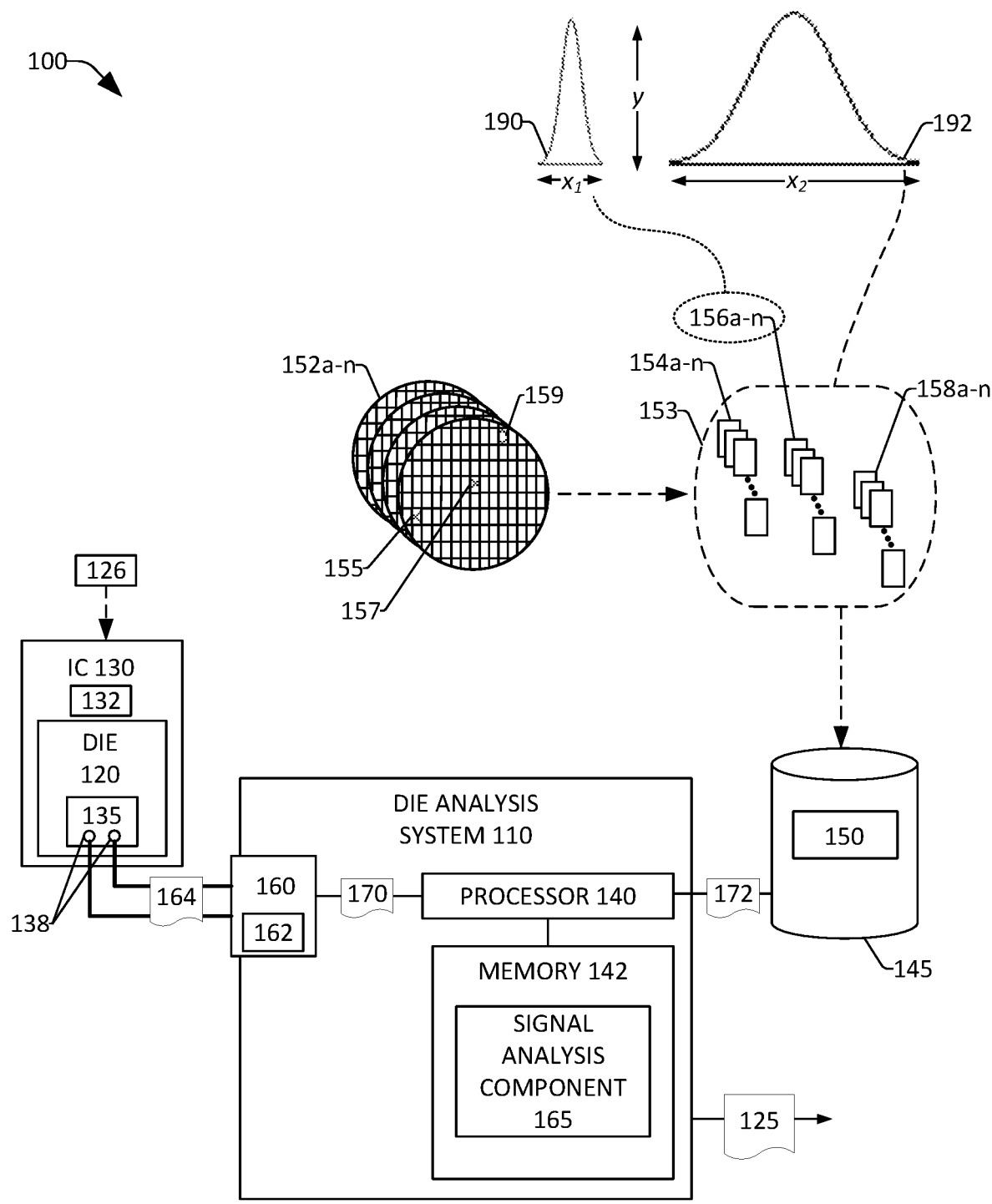
FIG. 1 illustrates a system for measuring a signal generated at an IC to facilitate authentication of the IC, according to an embodiment.

Various technologies pertaining to measuring a signal generated by a die-based test circuit incorporated into an integrated circuit (IC), and utilizing the measured signal to authenticate the IC, are now described with reference to the drawings, wherein like reference numerals are used to refer to like elements throughout. In the following description, for purposes of explanation, numerous specific details are set forth in order to provide a thorough understanding of one or more aspects. It may be evident, however, that such aspect(s) may be practiced without these specific details. In other instances, well-known structures and devices are shown in block diagram form in order to facilitate describing one or more aspects.

As used herein, the terms "component" and "system" are intended to encompass computer-readable data storage that is configured with computer-executable instructions that cause certain functionality to be performed when executed by a processor. The computer-executable instructions may include a routine, a function, or the like. It is also to be understood that a component or system may be localized on a single device or distributed across several devices. The terms "component" and "system" are also intended to encompass hardware configured to cause certain functionality to be performed, where such hardware can include, but is not limited to including, Field-programmable Gate Arrays (FPGAs), Application-specific Integrated Circuits (ASICs), Application-specific Standard Products (ASSPs), System-on-a-chip systems (SOCs), a programmable logic device (PLD), Complex Programmable Logic Devices (CPLDs), etc.

Further, the term "or" is intended to mean an inclusive "or" rather than an exclusive "or". That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form. Additionally, as used herein, the term "exemplary" is intended to mean serving as an illustration or example of something and is not intended to indicate a preference.

As previously mentioned, supply chain management and inventory tracking are important aspects in ensuring security and/or trust of devices, particularly computers and other electronic devices that utilize ICs. The various embodiments presented herein relate to measuring a signal generated by a die-based test circuit incorporated into an IC and utilizing the measured signal to identify whether the die and/or the IC was fabricated in accordance with a supplier's specification and/or whether any process labelling assigned to the die and/or the IC is correct. The die can be formed from any suitable material, e.g., a semiconductor material, a silicon (Si) based material, a germanium (Ge) based material, a Si—Ge based material, a gallium arsenide (GeAs) based material, an indium phosphide (InP) based material, etc., wherein the die is cut from a wafer formed from the material. Depending upon how the wafer was manufactured, one or more properties can vary across the wafer, and accordingly, a first die cut from a first position of the wafer can have a different property to a second die cut from a second position of the wafer, wherein the first die and the second die have the same dimensions.

Each respective IC (test IC and reference ICs) includes a test circuit incorporated into the die material incorporated into the IC, wherein a magnitude and/or waveform of any signal generated at the test circuit is a function of one or more characteristics of the die material forming that test circuit.

A reference value (reference signature, reference sensor response, reference response) measured from test circuits incorporated into a plurality of dies (reference dies) originating from a known common location in a plurality of reference wafers can be established by measuring sensor responses from the test circuits respectively incorporated into the dies, e.g., a database of one or more signal measurements can be compiled for the various die locations for the plurality of reference wafers manufactured under known conditions, using known equipment, etc. The variation between the reference value and a test value (test signature, test sensor response, test response) measured for a die identified as being from the same location as the reference dies from which the reference value was derived can be utilized to confirm or deny whether the die has been manufactured in accordance with a customer's expectation and/or requirement. Further, a customer can obtain a reference value from a "gold standard" wafer, wherein the manufacturer of the wafer also provides all pertinent information regarding manufacture of the wafer. The gold standard wafer functions as a baseline for a test value to be compared with.

FIG. 1 illustrates a system 100, whereby one or more components included in the system 100 can be utilized to acquire a signal from a test circuit incorporated into a die to authenticate the die (and accordingly the IC formed with the die incorporated therein), wherein the signal is a function of one or more properties of the die. The system 100 includes a die analysis system 110, wherein the die analysis system 110 is configured to measure a test value obtained from a test circuit incorporated into a die 120, and based upon comparison with one or more expected reference values, the die analysis system 110 can generate a notification 125 of whether the die 120 satisfies a requirement(s), or not. In an embodiment, the die 120 can be fabricated in accordance with a customer specification 126, wherein the specification 126 can specify that the die 120 is fabricated under a set of preferred conditions.

The die 120 can be incorporated into an IC 130. Further, a label 132 can be provided with the die 120 and/or the IC 130, wherein the label 132 provides information regarding manufacture of the die 120 and/or the IC 130. For example, the label 132 can provide information regarding a manufacturer name or logo, a date of manufacture, a time of manufacture, a manufacturing location, an identifier of fabrication equipment utilized to fabricate the die, a part number, a part production batch number, a serial number, operator information, a random sequence, etc. In an embodiment, information included in the label 132 can be provided separately, e.g., as an electronic file, paper file, etc., that accompanies the die 120 and/or the IC 130, Further, the label 132 can be a code utilized in a manufacturer's lookup table to identify any characteristics pertaining to the chip. The label 132 can include information regarding which wafer a die was sourced from, where on the wafer the die was cut from, and/or location of the wafer in a lot, as further described below, wherein this information can be utilized to determine that the received die 120, and IC 130, is as expected.

A test circuit 135 can be fabricated into the die 120, wherein one or more values (e.g., electrical signal) measured at the test circuit 135 are based upon the structure and/or composition of material forming the die 120; the composition of the die material affects operation of the test circuit 135 formed therein. As mentioned, the die 120 can be formed (e.g., cut from) from any suitable semiconductor material, e.g., a wafer comprising any of Si, Ge, Si—Ge, InP, etc. For the sake of readability, the following description is directed towards an Si-based wafer, however the wafer can be of any suitable material, as previously mentioned.

The test circuit 135 can include at least one of a physical unclonable function (PUF), a ring oscillator, a resistor, a capacitor, a transistor, an inductor, a trace, a via, etc. In an embodiment, the test circuit should be designed such that the variation in properties (e.g., owing to manufacturing process variations) between respective dies can be detected. Accordingly, the test circuit should be configured to generate a signal response that can distinguish a minute variation in material property between a first die and a second die, accordingly the test circuit is configured to be a high resolution test circuit (HRTC) that can detect process variation between dies at a desired level of resolution. In an embodiment, the test circuit can be instantiated in a FPGA such that various test circuit configurations can be obtained based upon a particular selection of the various reconfigurable interconnect(s) and logic blocks. Thus, a manufacturer has no idea of which test circuit configuration is to be utilized during testing of an IC. Further, during testing, signal measurements can be taken from a plurality of test circuit configurations available with the different interconnects and logic blocks selected. From the plurality of test circuit configurations available, a particular test circuit configuration may be determined that produces signal measurements having a high degree of repeatability across a plurality of dies having the same or similar material properties, thereby improving the accuracy and repeatability of the die authentication process.

Operationally, a test circuit 135 depends upon the uniqueness of its physical microstructure, including the microstructure of the die 120. The microstructure(s) depends on random factors (e.g., physical, chemical, microstructural and/or metallographic) introduced during Manufacturing, wherein the random factors can be Ullpredietable and uncontrollable which results in different wafer structures being formed on different fabrication equipment, and accordingly, dies formed therefrom have different properties between wafers. Hence, the properties of the material forming the die 120 can affect operation of the test circuit 135. For example, a first die and a second die, having the same physical dimensions, have respectively located thereon a first HRTC operating as a first test circuit and a second HRTC operating as a second test circuit, wherein the first HRTC and the second HRTC are formed with a high degree of precision, such that, for all intents and purposes, the first HRTC and the second HRTC are identical. Hence, when the first HRTC and the second HRTC are energized, any differences in measurements taken from the first HRTC and the second HRTC can be ascribed to a difference(s) in the composition and/or structure of the first die relative to the second die.

To facilitate connection of the test circuit 135 to the die analysis system 110, the test circuit includes one or more connectors 138, wherein the one or more connectors 138 can be pins located externally on the IC 130, or any other suitable component to facilitate connection.

The die analysis system 110 can include a processor 140 and memory 142, where the memory 142 comprises components that are executed by the processor 140. The die analysis system 110 further comprises a data store 145 which is configured to retain data. In an embodiment, the data store 145 can store reference data 150 (historical data), wherein the reference data 150 is compiled based upon one or more measurements obtained from a respective test circuit in a respective die cut from a respective wafer. For example, the reference data 150 is compiled from a plurality of wafers 152a-n and a plurality of dies, collectively grouped as dies 153, where n is a positive integer.

By comparing the value measured from the die 120 with one or more values in the reference data 150 taken from a corresponding position over a plurality of wafers a determination can be made regarding veracity of information provided in the label 132, and whether the die 120 was fabricated in accordance with the specification 126.

As shown in FIG. 1, the data 150 can be compiled for the plurality of dies 153, fabricated from the plurality of wafers 152a-n. To facilitate correlating a variation in a die property upon test circuit measurement, as a function of die location within a wafer, each die is identified with the location from which it was located in the respective wafer 152a-n. For example, a plurality of dies 154a-n were sourced from a lower left location 155 of the wafers 152a-n, a plurality of dies 156a-n were sourced from a central location 157 of the wafers 152a-n, a plurality of dies 158a-n were sourced from an upper right location 159 of the wafers 152a-n, etc. In an example, label 132 indicates that die 120 is cut from a central position (central position 157) on a wafer, and hence, a measurement(s) sourced from die 120 is to be compared with the reference data 150 comprising values sourced from the dies 156a-n, to enable a determination that the one or more properties of die 120 match the one or more property distributions compiled in the reference data for dies 156a-n sourced for the location common to die 120.

The die analysis system 110 includes a test port 160 which is connected to the test circuit 135, wherein the test port 160 includes any devices and components necessary to obtain a measurement from the test circuit 135. For example, the test port 160 can include a power supply (not shown) configured to energize the test circuit 135, a sensor 162 configured to measure a signal 164 generated at the test circuit 135 and generate a measurement 170 (sensor response, measured signal), etc. The measurement 170 is generated based upon a magnitude, a waveform, etc., of signal 164.

In an embodiment, the memory 142 includes a signal analysis component 165 that is executed by the processor 140. The signal analysis component 165 is utilized to compare the measurement 170 generated by the sensor 162 with the reference data 150. The signal analysis component 165 is further connected to the data store 145, wherein the signal analysis component 165 can request and receive reference data 150 that pertains to the die 120 being tested.

During testing, the information in the label 132 can be entered into the die analysis system 110, e.g., manually via an input device, or automatically via a reader configured to the read the label 132. Continuing the previous example, the label 132 can identify the die 120 as being a die cut from the central position of a wafer (region 157), and hence, the measurement 170 is to be compared with the reference data 150 gathered for dies 156a-n. The signal analysis component 165 is further configured to compare the measurement 170 with a value 172 derived from the reference data 150 pertaining to the dies 156a-n, wherein the value 172 can be an average value, an average value with a degree of measurement range, a median value, a mean value, etc. Based upon the comparison, the signal analysis component 165 is further configured to generate the notification 125 of whether the measurement 170 matches, or is within an acceptable range of, the value 172. In the event of the measurement 170 matching the value 172, the notification 125 indicates that the die 120 was fabricated from the central position 157 of the wafer. Alternatively, in the event of the measurement 170 not matching the value 172, the notification 125 indicates that the die 120 was not (or probably not)

fabricated from the central positon 157 of the wafer, wherein the die 120 can be quarantined for further analysis.

FIG. 1 presents two distribution plots 190 and 192. The distribution plot 190 is the distribution of measurements (e.g., test values) obtained from a plurality of dies cut from a particular location of a plurality of wafers, e.g., plot 190 is the distribution of the measurements taken from dies 156a-n sourced from the central location 157 of the wafers 152a-n. The distribution plot 192 is the distribution of measurements obtained from all of the dies cut from a plurality of locations of a plurality of wafers, e.g., plot 192 is the distribution of the measurements taken from all the dies 153 (e.g., dies 154a-n plus the dies 156a-n, and further plus the dies 158a-n). As shown, the distribution plot 190 has a narrower range ($x_1$) in values than the range of values ($x_2$) for the distribution plot 192.

It is to be appreciated that while the foregoing is directed towards analysis of dies and their properties based upon their respective location in a wafer, the various embodiments can be extended to any applicable situation. For example, a wafer as a whole can be analyzed, and any measurements obtained therefrom can be compared with measurements previously obtained from other wafers, enabling a determination that the wafer is of an acceptable condition, or not.

Figure 2:
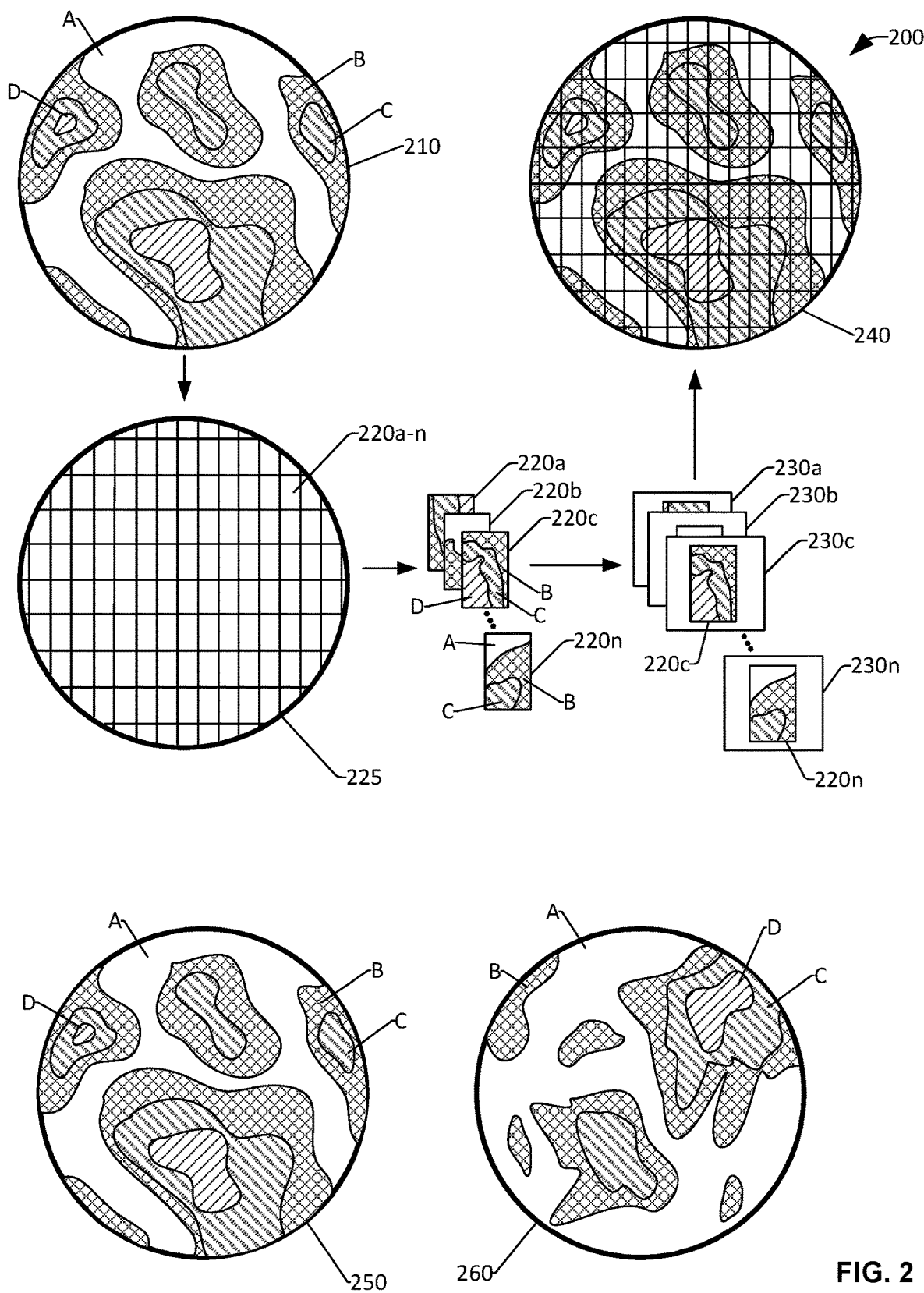
FIG. 2 illustrates a schematic of various wafers, dies, and property distributions, according to an embodiment.

Turning to FIG. 2, a schematic 200 is presented illustrating property variation across a wafer 210 and how the property variation can affect signal generation across a plurality of dies created from the wafer. As shown by the respective shading patterns, the wafer 210 has regions A, B, C, and D, wherein each region has a differing property to another region. Accordingly, when the wafer 210 is cut (per cutting pattern 225) to form the various dies 220a-n, the properties of material forming a first die can cause the first die to have different properties to material forming a second die. For example, the die 220n is formed from regions of materials A, B, and C, while the die 220c is formed from regions of materials B, C, and D, wherein dies 220n and 220c are cut from different regions of the wafer 210.

As previously described, the dies 220a-n can be incorporated into a plurality of respective ICs 230a-n, wherein FIG. 2 illustrates IC 230c having die 220c included therein, and the IC 230n having die 230n included therein. Hence, when IC 230c is tested, a different signal 164 (and measurement 170) will be obtained from a test circuit incorporated therein to the signal 164 obtained from a test circuit incorporated into IC 230n.

In an embodiment, by knowing the location of each die 220a-n cut from wafer 210, and the signals and/or measurements respectively obtained therefrom, a map of the property distributions can be reconstructed. As shown in map 240, by compiling the respective property measurements, in conjunction with the known original location of each die 220a-n within the wafer 210, it is possible to build the map 240, wherein map 240 is a replication of the property distribution of the wafer 210. It is to be appreciated that the property distributions illustrated in FIG. 2, and the size of the cutting pattern 225 are for illustrative purposes only, and any property variation across a die can occur.

If a wafer fabrication process is repeatable and under control, then a second wafer 250 will have a similar variation in properties to those of wafer 210. However, if conditions change in a wafer fabrication process, it is possible that a third wafer 260 fabricated under the changed conditions will have a different distribution of properties to the property distribution of wafer 210 (and wafer 250), e.g., as shown by the different distribution of regions A-D of wafer 260 versus the distribution of regions A-D of wafer 210. The difference in property variation between the wafer 260 and the wafer 210 can also result from the wafers 260 and 210 being produced on different machines while the machines are operating under the same or different operating conditions. The property variation between wafers 210 and 260 can be a result of a difference in any process variable, e.g., material composition of the wafer, variation in dopant concentration and distribution across respective wafers, changing conditions in a fabrication facility based upon any of operator, time of day, day of the week, location of a first fabrication facility versus a second fabrication facility, etc. Hence, while it is possible for a malicious entity to recreate the test circuit 135 on a die that the entity is trying to inject into an IC supply chain, wherein the test circuit 135 is fabricated with high precision, owing to the likelihood that the malicious entity is sourcing their wafers (copy wafers) from a supplier that is not the same supplier that produces the authorized wafers (authentic wafers), there is a high probability that a die (malicious die) cut from the same location (e.g., central position) on a copy wafer as a die (authentic die) is cut from an authorized wafer, the signal measured from the malicious die will have a different value to the signal measured for the authentic die, and the malicious die can be flagged for further investigation, even though the test circuits respectively applied to the malicious die and the authentic die have, for all intents and purposes, exactly the same configuration and/or structure. Hence, while a malicious entity can attempt to minimize any variation between configuration of a test circuit on a malicious die (e.g., minimize macro-variation), owing to property variation inherent in a process (e.g., micro-variation), the malicious entity cannot fully replicate a die that they desire to replace with a copy fabricated for malicious intent.

Further, the various embodiments presented herein can be directed towards ensuring an authorized supplier is providing dies manufactured in accordance with an agreed specification(s). A situation can occur where manufacturing conditions shift, even though the conditions may still be within an agreeable tolerance range. The shift in conditions can be detected by the change in signals measured for a sequence of dies all sourced from the same position on a series of wafers manufactured during the shift in manufacturing conditions. Further, the various embodiments presented herein can be utilized to detect when a supplier may be falsifying manufacturing data. For example, the supplier labels a die as being sourced from a first location of a wafer, but in actuality, the die is sourced from a different location of the wafer. In another example, the supplier labels a die as being sourced from a wafer manufactured at a certain time (e.g., hour x of day y), while in actuality the die was sourced from a die manufactured at an entirely different time. In a further example, the supplier labels a die as being sourced from a wafer fabricated on a first system, while the wafer was manufactured on a different system to that identified in the label.

Figure 3:
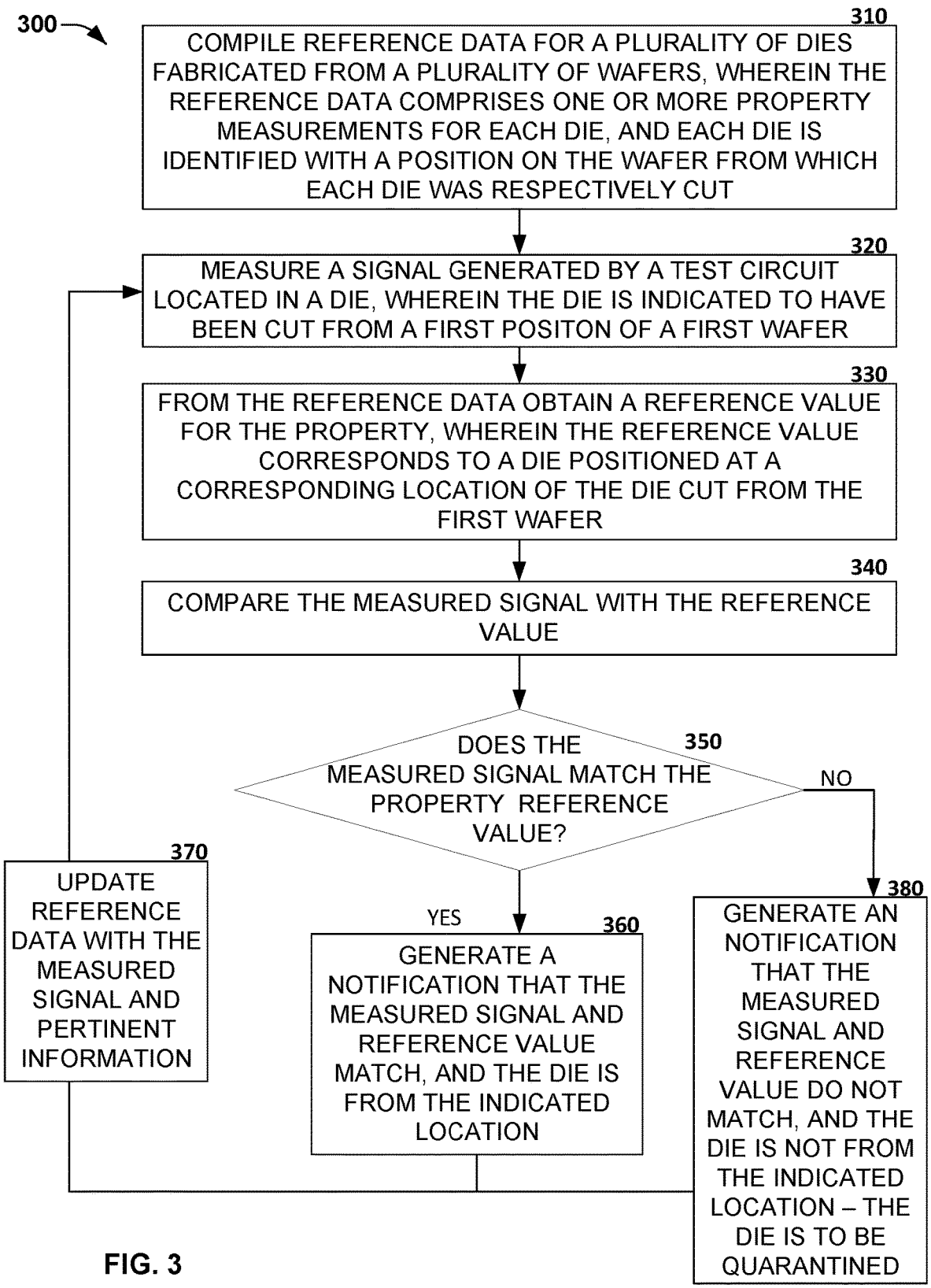
FIG. 3 is a flow diagram illustrating an exemplary methodology for measuring a signal generated at an IC to facilitate authentication of the IC.

FIG. 3 illustrates an exemplary methodology relating to measuring a property of a die incorporated into an IC to facilitate authentication of the IC. While the methodologies are shown and described as being a series of acts that are performed in a sequence, it is to be understood and appreciated that the methodologies are not limited by the order of the sequence. For example, some acts can occur in a different order than what is described herein. In addition, an act can occur concurrently with another act. Further, in some instances, not all acts may be required to implement the methodologies described herein.

FIG. 3 presents a method 300 for measuring a signal generated at an IC to facilitate authentication of the IC. Any of the following acts 310-380 can be performed by a die analysis component. At 310, reference data for a plurality of dies fabricated from a plurality of wafers is compiled. The reference data comprises one or more property measurements for each die, and each die is identified with respect to a position on the wafer from which each die was respectively cut.

At 320, a signal from a test circuit incorporated into a test die is measured, wherein the test die is accompanied with an indication of a positon of where the test die was cut from a first wafer.

At 330, the reference data is reviewed to obtain a reference value for the property, wherein the reference property value corresponds to measurements taken from a plurality of dies cut from a plurality of wafers positioned at a corresponding location of the test die cut from the first wafer.

At 340, the signal measured from the test die is compared with the reference property value obtained from the reference data.

At 350, a determination is made whether the measured signal matches the property reference value. In an embodiment, the determination of a match can be based upon the measured signal having a value that is the same as the property reference value. In another embodiment, the determination of a match can be based upon the measured signal having a value that is within a desired range of the property reference value. In another embodiment, rather than the property reference value having a particular value, the property reference value can be a value range generated from the values compiled in the reference data, and the determination comprises determining that the measured signal is within the range for a match to occur.

At 360, in the event of the measured signal and reference value match, a notification is generated indicating that the die is from the indicated location. The method flow can proceed to 370 wherein the reference data can be updated with the measured signal along with any pertinent information (e.g., location of the die). The method flow can return to 320 whereupon a new die can be tested.

At 380, in the event of the measured signal and reference value do not match, a notification is generated indicating that the die is not from the indicated location, and the die can be quarantined for further analysis. The method flow can proceed to 370 wherein the reference data can be updated with the measured signal along with any pertinent information (e.g., location of the die). The method flow can return to 320 whereupon a new die can be tested.

In an embodiment, the reference data can be of such scope that in the event of a die being indicated as not being from the expected location, and yet the die is known to be from the indicated location, the measurement signal can be analyzed, and an indication as to what may have changed within the fabrication process can be determined. Accordingly, one or more conditions (operation settings) can be adjusted to address the result of the signal measurement. For example, two machine settings may both be operating within a specification, however, the combination of the machine settings may give rise to an unexpected condition in the wafer, e.g., greater thickness owing to the two conditions causing a higher rate of oxidation of the die material.

The various embodiments presented herein can be utilized to detect a plurality of events, including insertion of a die(s) or a wafer(s) into a supply chain, a chemical and/or metallurgical change in a wafer fabrication process, a fabrication excursion (e.g., quality event the fabrication foundry does not share), a shifted process that is operating within a specification, a mask change utilized in fabrication of a die or wafer, etc.

In another embodiment, the measured signal can be utilized to conduct diagnostic failure and prediction. For example, while in service, a plurality of IC devices undergo operational failure. Signals generated from a test circuit respectively located on each of the failed ICs can be measured, and it is determined that the magnitude of the signals is similar. Accordingly, any other ICs that have a similar test circuit signal (e.g., as identified during a previous authentication operation) can be identified, whereupon the identified ICs can be replaced with ICs having a test circuit signal identified as having a value not associated with the failed ICs. Hence, the various embodiments presented herein enable a failure preventative process to be put in place before the remaining potentially defective ICs fail.

In a further embodiment, a customer can utilize the authentication procedure described herein to identify whether the manufacture of the ICs is not delivering ICs respectively including all of the dies fabricated from a given wafer. For example, the manufacturer indicates that 100 dies are cut from a wafer, and 100 ICs will be delivered wherein each IC includes one of the dies. However, based upon subsequent testing of the 100 ICs received, it is apparent that 50 of the ICs have been manufactured with dies from the wafer, as expected, while the other 50 ICs include dies manufactured from an entirely different wafer(s) to that expected.

Further, the various embodiments presented herein enable over-testing and/or over-operation of devices to be detected. For example, excessive testing of a device can cause a shift in the properties of the die material in which a test circuit has been incorporated. Thus, for an IC that has undergone minimal testing, the material properties remain relatively unchanged and the signals measured at the test circuit for each test are similar. However, if an IC has undergone excessive testing, the materials properties may have been affected to the point that a signal measured at the test circuit is different to the expected reference value. With regard to the over-operation of a die and/or IC, during operation of the IC, the IC may experience operational conditions that place the IC under unexpected stress, fatigue, etc., and accordingly, the properties of the die material are affected. For example, the IC may operate under a condition of higher than expected temperature, which causes a change in a property of the die, wherein the change can be detected at the test circuit.

As previously mentioned, a fab lab produces wafers and chips that have a deterministic trend across them, and this trend is unique to the fab (e.g., a fab's failure analysis lab) at some detectable level. Based thereon, a customer can create a design (e.g., a test circuit 135) that consistently renders these trends to create a wafer signature for a fab process. Further, the customer can compile a library of reference data 150 (e.g., wafer signatures) using die, wafer and lot data provided by the supplier (vendor) of the dies and wafers. The customer can measure each die on the received ICs as part of a part acceptance process. Measured data is stored to be combined with data from other chips on the same wafer (possibly lots) as they arrive. The customer can monitor full and partial wafer data for statistical differences and correlate that with other indicators. As full wafer sets are built, some ICs can be selected for destructive testing to facilitate further confidence that the remainder of the ICs from that wafer have the same, expected qualities.

Figure 4:
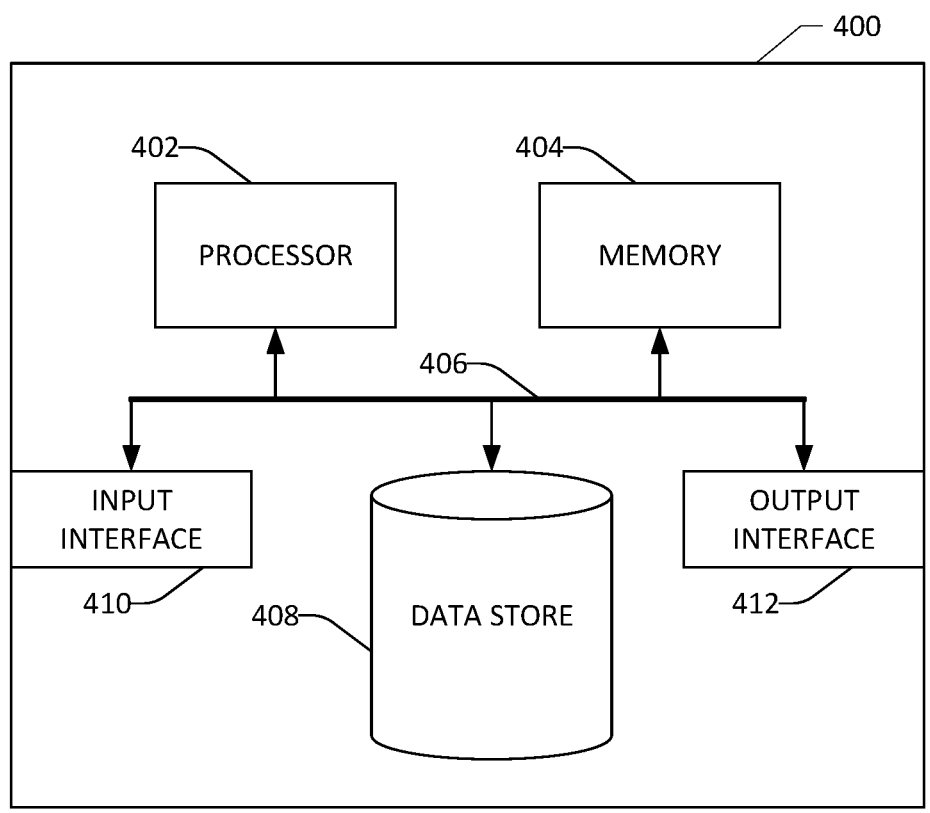
FIG. 4 illustrates an exemplary computing device.

Referring now to FIG. 4, a high-level illustration of an exemplary computing device 400 that can be used in accordance with the systems and methodologies disclosed herein is illustrated. For instance, the computing device 400 may be utilized to perform any of generating a watermark, creating a signature from a watermark, and/or confirming IC authenticity. For example, computing device 400 can operate as the die analysis system 110. The computing device 400 includes at least one processor 402 that executes instructions that are stored in a memory 404. The instructions may be, for instance, instructions for implementing functionality described as being carried out by one or more components discussed above or instructions for implementing one or more of the methods described above. The processor 402 may access the memory 404 by way of a system bus 406. In addition to storing executable instructions, the memory 404 may also store operating parameters, required operating parameters, and so forth.

The computing device 400 additionally includes a data store 408 that is accessible by the processor 402 by way of the system bus 406. The data store 408 may include executable instructions, operating parameters, required operating parameters, etc. The computing device 400 also includes an input interface 410 that allows external devices to communicate with the computing device 400. For instance, the input interface 410 may be used to receive instructions from an external computer device, from a user, etc. The computing device 400 also includes an output interface 412 that interfaces the computing device 400 with one or more external devices. For example, the computing device 400 may display text, images, etc., by way of the output interface 412.

Additionally, while illustrated as a single system, it is to be understood that the computing device 400 may be a distributed system. Thus, for instance, several devices may be in communication by way of a network connection and may collectively perform tasks described as being performed by the computing device 400.

As used herein, the terms "component" and "system" are intended to encompass computer-readable data storage that is configured with computer-executable instructions that cause certain functionality to be performed when executed by a processor. The computer-executable instructions may include a routine, a function, or the like. It is also to be understood that a component or system may be localized on a single device or distributed across several devices. The terms "component" and "system" are also intended to encompass hardware configured to cause certain functionality to be performed, where such hardware can include, but is not limited to including, Field-programmable Gate Arrays (FPGAs), Application-specific Integrated Circuits (ASICs), Application-specific Standard Products (ASSPs), System-on-a-chip systems (SOCs), Complex Programmable Logic Devices (CPLDs), etc.

Various functions described herein can be implemented in hardware, software, or any combination thereof. If implemented in software, the functions can be stored on or transmitted over as one or more instructions or code on a computer-readable medium. Computer-readable media includes computer-readable storage media. A computer-readable storage media can be any available storage media that can be accessed by a computer. By way of example, and not limitation, such computer-readable storage media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Disk and disc, as used herein, include compact disc (CD), laser disc, optical disc, digital versatile disc (DVD), floppy disk, and blu-ray disc (BD), where disks usually reproduce data magnetically and discs usually reproduce data optically with lasers. Further, a propagated signal is not included within the scope of computer-readable storage media. Computer-readable media also includes communication media including any medium that facilitates transfer of a computer program from one place to another. A connection, for instance, can be a communication medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio and microwave are included in the definition of communication medium. Combinations of the above should also be included within the scope of computer-readable media.

What has been described above includes examples of one or more embodiments. It is, of course, not possible to describe every conceivable modification and alteration of the above structures or methodologies for purposes of describing the aforementioned aspects, but one of ordinary skill in the art can recognize that many further modifications and permutations of various aspects are possible. Accordingly, the described aspects are intended to embrace all such alterations, modifications, and variations that fall within the spirit and scope of the appended claims. Furthermore, to the extent that the term "includes" is used in either the details description or the claims, such term is intended to be inclusive in a manner similar to the term "comprising" as "comprising" is interpreted when employed as a transitional word in a claim.

What is claimed is:

1. A method comprising:
    measuring a signal generated by an electrical circuit that is formed in a die incorporated in an integrated circuit (IC), wherein the die is labelled as being cut from a first location in a first wafer;
    comparing the measured signal with a reference value derived from a reference die sourced from a second wafer, wherein the reference die is cut from the second wafer at a reference location in the second wafer that corresponds to the first location in the first wafer; and
    responsive to determining that the measured signal is within a predefined range of the reference value, outputting an indication that the die is sourced from the first location in the first wafer.

2. The method of claim 1, wherein responsive to determining that the measured signal is not within the predefined range of the reference value, outputting an indication that the die is not sourced from the first location in the first wafer.

3. The method of claim 1, wherein the electrical circuit includes at least one of a high resolution test circuit, a physical uncionable function, a ring oscillator, a resistor, a capacitor, a transistor, an inductor, a via, or a trace.

4. The method of claim 1, wherein the IC is included in one of a field programmable gate array (FPGA), an application-specific integrated circuit (ASIC), a processor, a microprocessor, a system on a ship (SoC), a programmable SoC, an application-specific standard product (ASSP), a programmable logic device (PLD), or a complex programmable logic device (CPLD).

5. The method of claim 1, wherein the die is formed from semiconductor material.

6. The method of claim 1, wherein the reference value is derived from a plurality of reference dies each sourced from a respective wafer, the reference die being a first reference die in the plurality of reference dies, each of the plurality of reference dies being cut from its respective wafer at a same reference location that corresponds to the first location in the first wafer.

7. The method of claim 1, wherein the labelling of the die includes at least one of a manufacturer name or logo, a date of manufacture, a time of manufacture, a manufacturing location, an identifier of fabrication equipment utilized to fabricate the die, a part number, a part production batch number, a serial number, operator information, or a random sequence.

8. The method of claim 1, wherein the electrical circuit is a configurable circuit, the signal generated by the electrical circuit while the electrical circuit has a first configuration, the method further comprising:
measuring a second signal generated by the electrical circuit while the electrical circuit has a second configuration;
comparing the second signal with a second reference value derived from the reference die; and
responsive to determining that the second signal is within a predefined range of the second reference value, outputting a second indication that the die is sourced from the first location in the first wafer.

9. The method of claim 1, further comprising reconfiguring the electrical circuit to have the second configuration prior to measuring the second signal.

10. A computer-readable storage medium comprising instructions that, when executed by a processor, cause the processor to perform acts comprising:
measuring a signal generated by an integrated circuit (IC), wherein the signal is generated by an electrical circuit formed in a first die incorporated in the IC, the first die having a label indicating that the first die is cut from a particular location in a first wafer;
comparing the measured signal with a reference value, wherein the reference value is derived from a plurality of reference dies each sourced from a respective wafer, wherein each of the reference dies is cut from a common location in its respective wafer that corresponds to the location from which the first die is labelled as being cut from the first wafer; and
responsive to determining that the measured signal has a value within a predefined range of the reference value, outputting an indication that the die is sourced from the location indicating by the label; and
responsive to determining that the measured signal has a value that is not within the predefined range of the reference value, outputting an indication that the die is not sourced from the location indicated by the label.

11. The computer-readable storage medium of claim 10, wherein the electrical circuit includes at least one of a high resolution test circuit, a physical uncionable function, a ring oscillator, a resistor, a capacitor, a transistor, an inductor, a via, or a trace.

12. The computer-readable storage medium of claim 10, wherein each of the reference dies includes a test circuit formed thereon, wherein the test circuits have a same configuration, and wherein the reference value is based upon electrical signals output by the test circuits.

13. A method comprising:
receiving an electrical signal from a test circuit incorporated in an integrated circuit (IC), the test circuit formed on a die that is indicated as being cut from a wafer at a first location on the wafer;
comparing a value of a property of the electrical signal to a reference value indicative of an expected value of the property, the reference value selected for the comparing based upon the die being indicated as being cut from the wafer at the first location; and
outputting an indication that the die is cut from the first location based upon the value of the property being within a predefined range of the reference value.

14. The method of claim 13, the die being a first die, the first wafer being a first wafer, the reference value based upon a second electrical signal received from a second test circuit formed on a second die, the second die being cut from a second wafer at a second location on the second wafer that corresponds to a same position as the first location on the first wafer.

15. The method of claim 14, wherein the first test circuit and the second test circuit have a same configuration.

16. The method of claim 13, the wafer being a first wafer, wherein the reference value is based upon a plurality of electrical signals generated by a plurality of test circuits included on a plurality of dies, each of the plurality of electrical signals received from a respective test circuit in the plurality of test circuits, each of the test circuits being included on a respective die in the plurality of dies, each of the plurality of dies cut from a respective wafer at a same location corresponding to the first location on the first wafer.

17. The method of claim 13, wherein the test circuit comprises a physical unclonable function (PUF).

18. The method of claim 13, wherein the test circuit comprises a ring oscillator circuit.

19. The method of claim 13, wherein the test circuit is a configurable circuit included in a field-programmable gate array (FPGA).

20. The method of claim 13, wherein the first location is indicated by a label included on the die.

\* \* \* \* \*